United States Patent
Niki et al.

(10) Patent No.: US 8,238,114 B2
(45) Date of Patent: Aug. 7, 2012

(54) PRINTED WIRING BOARD AND METHOD FOR MANUFACTURING SAME

(75) Inventors: Ayao Niki, Ogaki (JP); Kazuhisa Kitajima, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 660 days.

(21) Appl. No.: 12/188,795

(22) Filed: Aug. 8, 2008

(65) Prior Publication Data

US 2009/0078451 A1  Mar. 26, 2009

Related U.S. Application Data

(60) Provisional application No. 60/988,887, filed on Nov. 19, 2007, provisional application No. 60/973,971, filed on Sep. 20, 2007.

(51) Int. Cl.
*H05K 7/10* (2006.01)

(52) U.S. Cl. .................. 361/767; 361/808; 174/262

(58) Field of Classification Search ................ 174/260, 174/261, 262, 263; 361/760, 768, 783, 748–751, 361/790, 792, 794, 808, 767, 728, 735
See application file for complete search history.

(56) References Cited

U.S. PATENT DOCUMENTS

| | | | | |
|---|---|---|---|---|
| 4,528,064 A | * | 7/1985 | Ohsawa et al. | 216/18 |
| 4,937,653 A | * | 6/1990 | Blonder et al. | 257/739 |
| 5,487,999 A | * | 1/1996 | Farnworth | 216/18 |
| 5,668,410 A | * | 9/1997 | Yamamoto | 257/737 |
| 5,686,702 A | * | 11/1997 | Ishida | 174/250 |
| 5,973,405 A | * | 10/1999 | Keukelaar et al. | 257/780 |
| 6,137,184 A | * | 10/2000 | Ikegami | 257/785 |
| 6,335,571 B1 | * | 1/2002 | Capote et al. | 257/787 |
| 6,548,898 B2 | * | 4/2003 | Matsuki et al. | 257/746 |
| 6,815,252 B2 | * | 11/2004 | Pendse | 438/107 |
| 6,956,165 B1 | * | 10/2005 | Hata et al. | 174/521 |
| 6,995,469 B2 | * | 2/2006 | Hatakeyama | 257/738 |
| 7,508,681 B2 | * | 3/2009 | Payne et al. | 361/792 |
| 7,911,805 B2 | * | 3/2011 | Haba | 361/791 |
| 7,964,800 B2 | * | 6/2011 | Kitada et al. | 174/255 |
| 2002/0008314 A1 | | 1/2002 | Takeuchi | |
| 2002/0046880 A1 | * | 4/2002 | Takubo et al. | 174/261 |
| 2004/0099716 A1 | | 5/2004 | Yuan et al. | |
| 2004/0232533 A1 | * | 11/2004 | Hatakeyama | 257/678 |
| 2007/0263370 A1 | | 11/2007 | Niki | |
| 2007/0273045 A1 | * | 11/2007 | Kitada et al. | 257/782 |
| 2008/0169120 A1 | * | 7/2008 | Inagaki et al. | 174/255 |

FOREIGN PATENT DOCUMENTS

| | | |
|---|---|---|
| JP | 10-41610 A | 2/1998 |
| JP | 2000-252380 | 9/2000 |
| JP | 2005-302922 | 10/2005 |
| JP | 2006-19591 A | 1/2006 |
| JP | 2007-300147 | 11/2007 |
| KR | 10-2000-0071720 | 11/2000 |

(Continued)

*Primary Examiner* — Hoa C Nguyen
(74) *Attorney, Agent, or Firm* — Oblon, Spivak, McClelland, Maier & Neustadt, L.L.P.

(57) ABSTRACT

A printed wiring board includes multiple conductive layers having conductive circuits, multiple resin insulation layers having openings and including the uppermost resin insulation layer positioned as the outermost layer of the resin insulation layers, multiple via conductors formed in the openings, respectively, and connecting the conductive circuits in the conductive layers, and multiple component-loading pads formed of a copper foil and positioned to load an electronic component. The resin insulation layers and the conductive layers are alternately laminated, and the component-loading pads are formed on the uppermost resin insulation layer.

8 Claims, 16 Drawing Sheets

FOREIGN PATENT DOCUMENTS

| | | |
|---|---|---|
| KR | 10-0366383 | 12/2002 |
| KR | 10-2007-0059996 | 6/2007 |
| KR | 10-2008-0079997 | 9/2008 |
| TW | 507511 | 10/2002 |
| TW | 592019 | 6/2004 |
| TW | I268130 | 12/2006 |

* cited by examiner

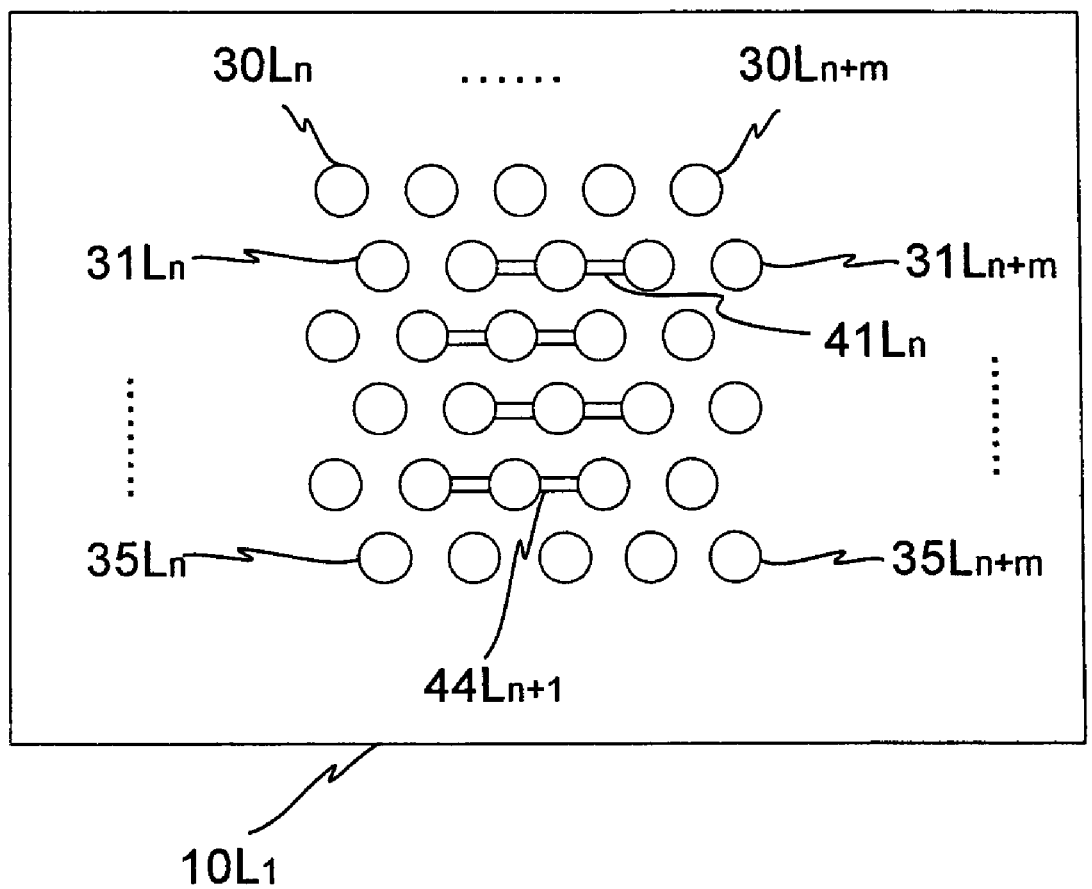

BACKGROUND ART

PRINTED WIRING BOARD AND METHOD FOR MANUFACTURING SAME

CROSS-REFERENCE TO RELATED APPLICATIONS

The present application claims the benefits of priority to U.S. Applications Nos. 60/973,971, filed Sep. 20, 2007, and 60/988,887, filed Nov. 19, 2007. The contents of those applications are incorporated herein by reference in their entirety.

BACKGROUND OF THE INVENTION

1. Field of the Invention

The present invention relates to a printed wiring board, more specifically, to a printed wiring board structured with alternately laminated conductive circuits and insulation layers and having pads on one surface to load electronic components such as an IC.

2. Discussion of the Background

In recent years, as electronic devices become more highly functional, they are also made smaller and thinner. Accordingly, electronic components such as IC chips and LSIs are becoming highly integrated at a rapid pace.

In a printed wiring board manufactured by the method described in Japanese Laid-Open Patent Application 2006-19591, an electrolytic plated layer is formed on a metal foil by electrolytic plating, and the electrolytic plated layer is used as an etching resist to form a conductive circuit by etching. Then, the conductive circuit is used as pads for mounting a semiconductor element.

A printed wiring board manufactured by the method according to Japanese Laid-Open Patent Application H10-41610 has a substrate made of glass epoxy or the like, which causes the printed wiring board to thicken.

The contents of those publications are incorporated herein by reference in their entirety.

SUMMARY OF THE INVENTION

According to one aspect of the present invention, a printed wiring board includes multiple conductive layers having conductive circuits, multiple resin insulation layers having openings and including the uppermost resin insulation layer positioned as the outermost layer of the resin insulation layers, multiple via conductors formed in the openings, respectively, and connecting the conductive circuits in the conductive layers, and multiple component-loading pads formed of a copper foil and positioned to load an electronic component. The resin insulation layers and the conductive layers are alternately laminated, and the component-loading pads are formed on the uppermost resin insulation layer.

According to another aspect of the present invention, a method for manufacturing a printed wiring board includes securing a metal foil to a support board by gluing or bonding, forming a resin insulation layer on the metal foil, forming openings in the resin insulation layer, forming a conductive circuit on the resin insulation layer, forming in the openings via conductors to electrically connect the conductive circuit and the metal foil, separating the support board and the metal foil, and forming from the metal foil external terminals to electrically connect to another substrate or electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a schematic view (view 1) illustrating pads arranged on the outermost layer of a printed wiring board according to an embodiment of the present invention and wiring between the pads;

DETAILED DESCRIPTION OF THE PREFERRED EMBODIMENTS

Figure 1A:
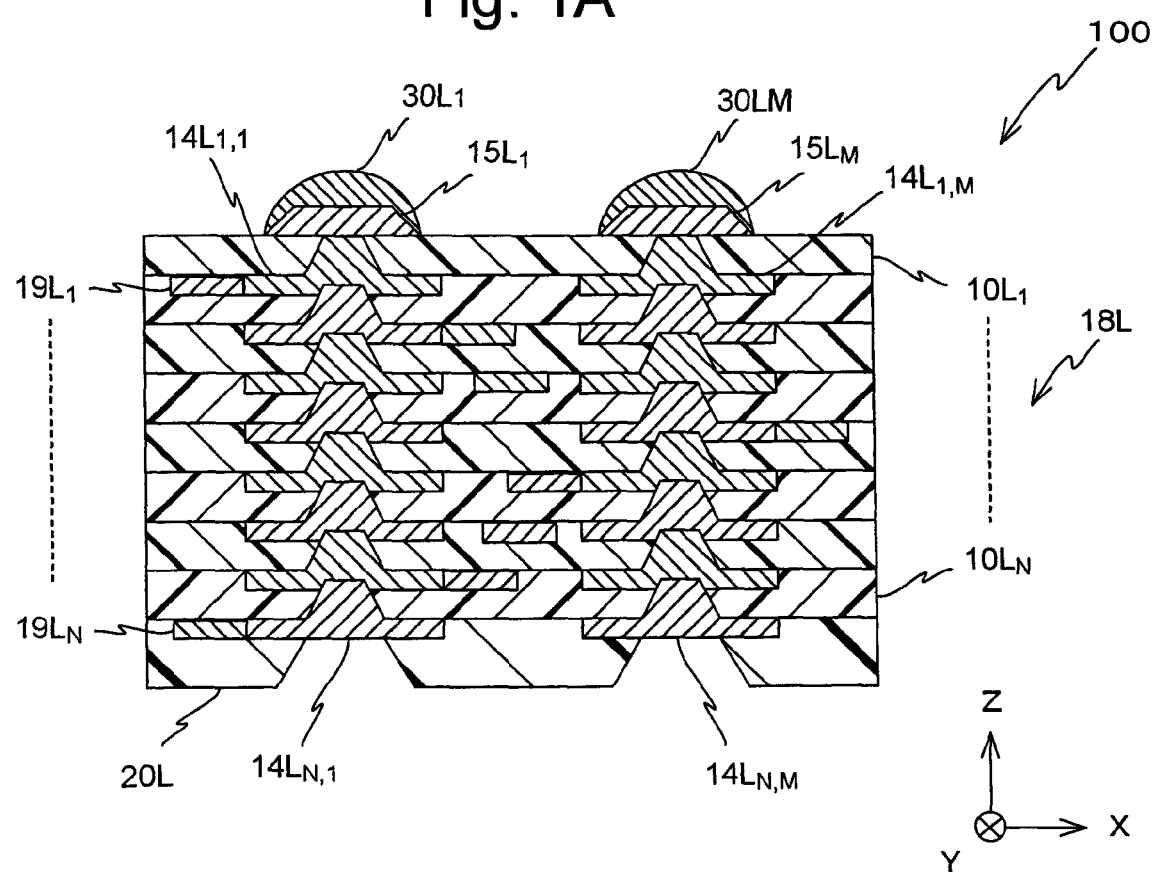
FIG. 1A is a cross-sectional view of a printed wiring board according to an embodiment of the present invention.

The embodiments will now be described with reference to the accompanying drawings, wherein like reference numerals designate corresponding or identical elements throughout the various drawings.

As shown in FIG. 1A, printed wiring board 100 according to an embodiment of the present invention has laminate (18L) having resin insulation layers ($10L_j$: j=1~N) and conductive layers ($19L_j$) with a conductive circuit (conductive pattern) laminated alternately, and via conductors for interlayer connections to connect the conductive circuits formed in separate conductive layers (including via conductors ($14L_{1,1}$~$14L_{N,M}$) corresponding to later-described first pads ($15L_k$: k=1~M)); first pads (first external connection terminals) ($15L_k$) formed on the surface positioned in the (+Z) direction (the first surface of the uppermost resin insulation layer ($10L_1$)); and (c) solder members (solder bumps) ($30L_k$) formed on the above pads ($15L_k$). Also, printed wiring board 100 has (d) solder resist (20L) formed on the surface in the (–Z) direction (the second surface of the lowermost resin insulation layer) of laminate (18L).

Figure 1B:
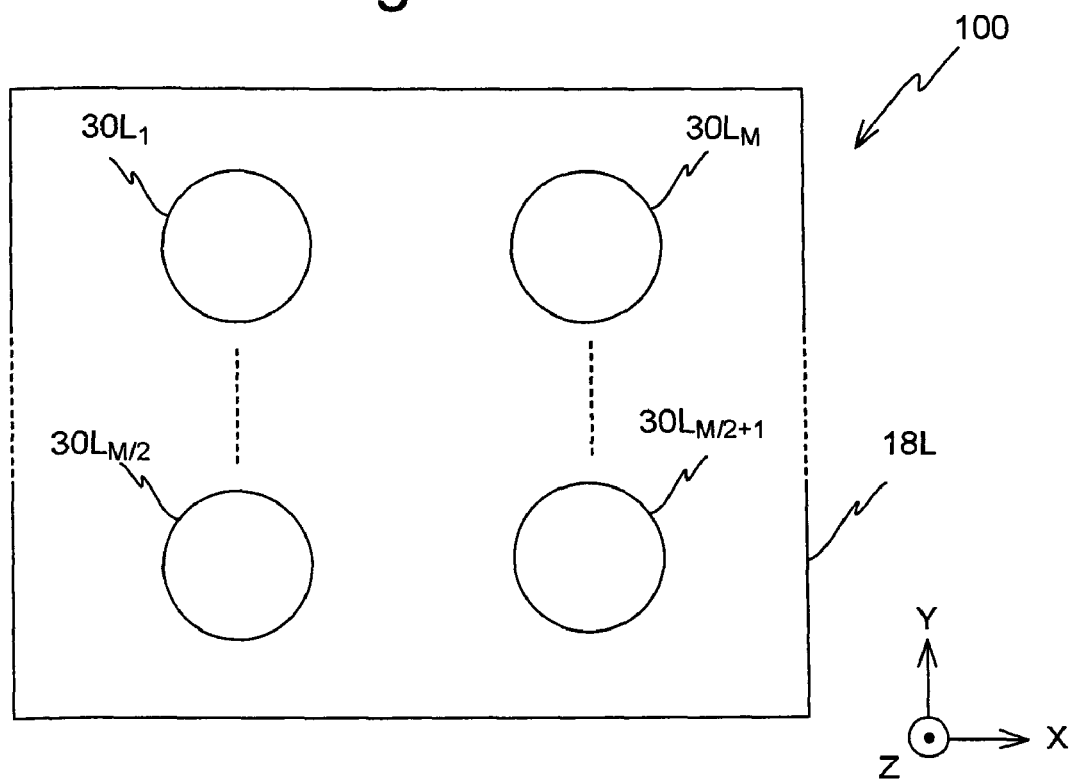
FIG. 1B is a plan view of a printed wiring board according to an embodiment of the present invention.

In printed wiring board 100, first pads ($15L_k$) on which solder members ($30L_k$) are formed are arranged, as shown in FIG. 1B, two-dimensionally on the first surface of the uppermost resin insulation layer ($10L_1$) to form a pad group.

Also, the solder resist has multiple openings. Those openings partially open the surface of conductive circuit ($19L_N$) formed on the second surface of the lowermost resin insulation layer, or the surfaces of via conductors. The openings formed in the solder resist may also partially open the surfaces of via conductors and portions of the conductive circuit (via lands) connected to the via conductors. Portions of the conductive circuit (the lowermost conductive circuit) or portions of via conductors exposed through the openings become the second pads (the second external connection terminals). Here, the first surface of each resin insulation layer indicates the surface where the first pads are formed; and the second surface of each resin insulation layer indicates the opposite surface, where the second pads are formed.

Figure 2A:
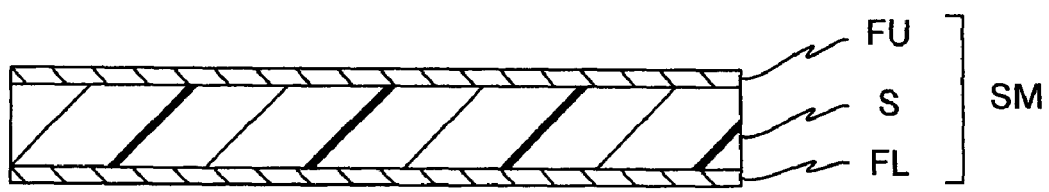
FIGS. 2A through 2C are views illustrating steps (step 1 through step 3) for manufacturing a printed wiring board according to an embodiment of the present invention.

Laminate (18L) is formed on support member (SM) as shown in FIG. 2A by an additive method or a subtractive method. On the outermost layer, solder resist (20L or 20U) is formed (see FIG. 6(B)), then, at a predetermined position the laminate is cut to be removed from support member (SM). Through the removal process, the outermost resin insulation layer opposite where solder resist (20U or 20L) is formed becomes uppermost resin insulation layer ($10U_1$ or $10L_1$). From the metal foil formed on the first surface of the uppermost resin insulation layer (the surface facing support member (SM), the surface of a printed wiring board to be exposed to the outside), component-loading pads (first external connection terminals) ($15L_1 \sim 15L_M$) are formed (see FIGS. 1A and 1B).

The component-loading pads are preferred to be truncated and in the X-Z cross-sectional view, as shown in FIG. 1A, the area of the bottom surface which is in contact with uppermost resin insulation layer ($10L_1$) is larger than the area of the upper surface where an electronic component will be mounted.

A protective film is formed by an electroless plated film or the like on the component-loading pads after the pads are formed. Accordingly, peripheral portions ($94A_1$ and $94B_1$) of the protective film will not protrude beyond the first pad (see FIG. 12).

The solder members are formed on the truncated-shaped pads to cover the top and side surfaces of the first pads (see FIG. 2A).

Next, manufacturing an electronic component having the above structure is described with reference to the material of each element. First, support member (SM) is prepared (see FIG. 2A). Support member (SM) is structured by laminating conductive layers (FU, FL) on both surfaces of insulation material (S). Conductive layers (FU, FL) to structure the support member (SM) are a metal foil with a thickness of approximately a few μm to a few tens of μm. As such, on surfaces of the support member (support board), metal layers are preferred to be formed. From the point of forming a uniform thickness, the metal layers are more preferably made of metal foil.

As for the above support member (SM), material such as conductive layers with the above thickness secured by glue or the like on the surfaces of insulation material (S) may be used.

As for the above insulation material (S), for example, a glass laminate impregnated with bismaleimide-triazine resin, glass laminate impregnated with polyphenylen ether resin, or glass laminate impregnated with polyimide resin may be used. On both surfaces of such material, metal foil such as copper foil may be secured by a known method.

Also, a commercially available double-sided copper-clad laminate or single-sided copper-clad laminate may be used. As for such a commercially available laminate, for example, "MCL-E679 FGR" (made by Hitachi Chemical Co., Ltd., located in Shinjuku, Tokyo) may be listed. For example, the support member may be a glass epoxy laminate having a thickness of 0.4 mm and laminated with a copper foil having a thickness of 5 μm on two sides. In addition, as for support member (SM), a metal plate may also be used.

Figure 2B:
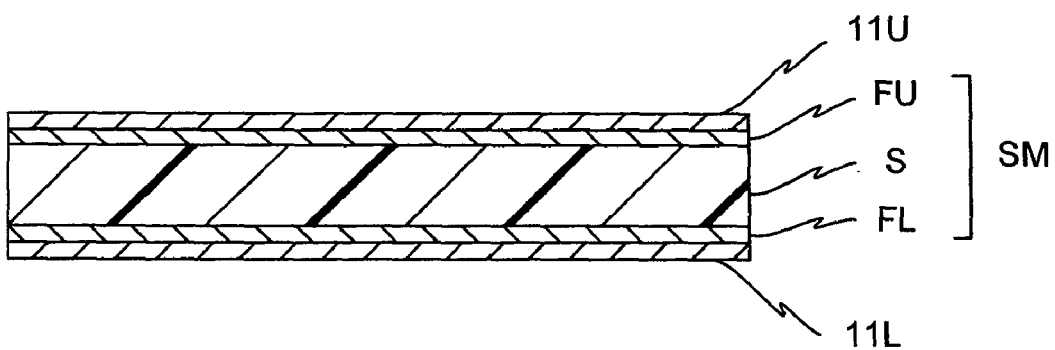

Then, as shown in FIG. 2B, the first surface of metal foil (11U or 11L) is laminated on conductive layer (FU or FL) so as to face either conductive layer (FU or FL). As for the metal foil, for example, copper foil, nickel foil or titanium foil may be used. The second surface of such metal foil, opposite the first surface, is preferred to be a matted surface. For example, when using copper foil for a metal foil (11U or 11L), it is preferred to use thickness of approximately 3 μm to approximately 35 μm.

Figure 2C:
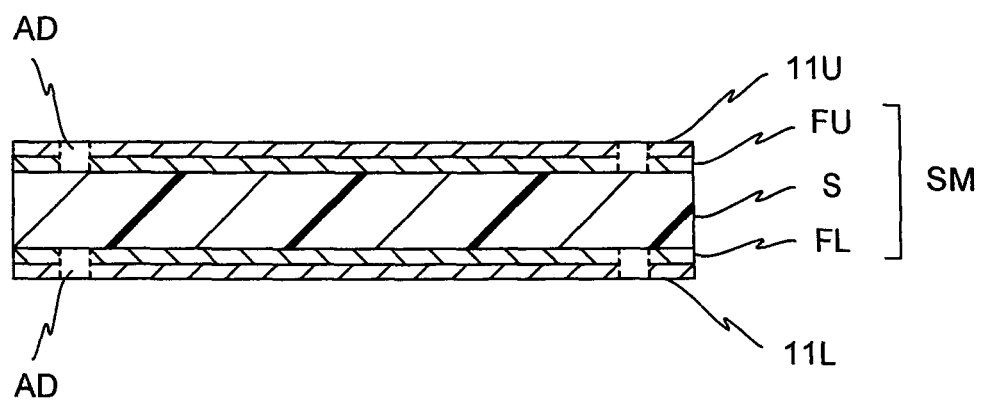
Figure 2D:
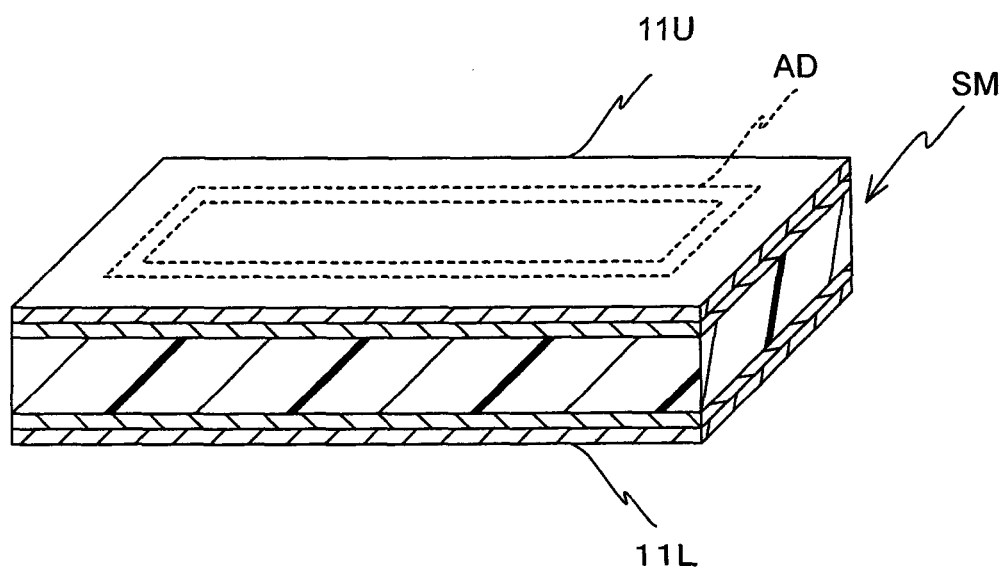
FIG. 2D is a plan view of FIG. 2C.

Next, as shown in FIGS. 2C and 2D, conductive layer (FU or FL) and the above metal foil are preferred to be secured to each other by gluing or bonding at the peripheral portions of support member (SM) (the portions indicated as "AD"). In the present embodiment, the portions of the conductive layer and the metal foil to be secured are preferably approximately 10 to approximately 30 mm inside from the edges of the metal foil toward the center portion. More preferably, the portions are approximately 20 mm inside from the edges. Also, it is preferred that both are secured approximately 1 to approximately 5 mm wide, and more preferably approximately 2 mm wide.

The conductive layer (support board) and metal foil may be secured, for example, by using ultrasound or an adhesive agent. Securing by ultrasound is superior in regard to adhesive strength and convenience. When securing by ultrasound, using ultrasound bonding equipment for example, securing at the required portions, which are positioned from the edges of support member (SM) as described above, with the required width and configurations may be conducted. As long as the conductive layer and metal foil are removed without trouble at the later-described removal step, securing in a rectangular shape (see FIG. 2D) or a grid (not shown in the drawing) may be employed.

If the conductive layer and the metal foil are secured, when forming a later-described interlayer resin insulation layer or conductive layer, the following trouble may be prevented from occurring. When forming a resin insulation layer, since heating and cooling-off are repeated, the resin insulation layer repeatedly expands and shrinks. Since the resin insulation layer is formed on a metal foil, the metal foil repeats expansion and shrinkage following the resin insulation layer. As a result, distortion or warping may easily occur in the metal foil. Also, substantial distortion or warping may cause snapping or bending, and thus the metal foil may break. On the other hand, by securing the conductive layer and metal foil, such trouble may be prevented from occurring.

Also, when forming a conductive layer by a plating process, the occurrence of the following trouble may be prevented as well. When performing plating, a substrate is required to be immersed in a solution such as a plating solution. In such a case, unless the conductive layer and the metal foil are secured, the plating solution seeps between them, which may cause peeling between them. On the other hand, by securing the conductive layer and the metal foil, such a problem may be prevented from occurring.

Figure 3A:
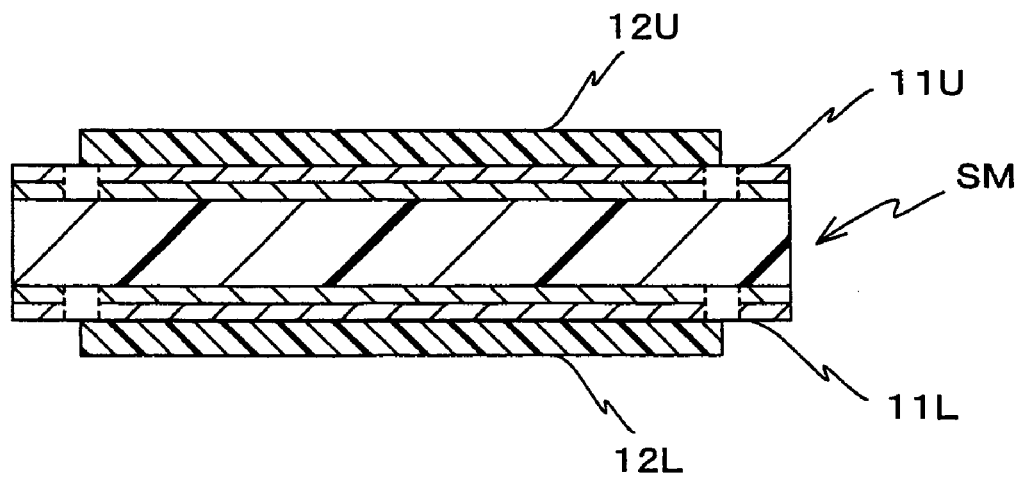
FIGS. 3A through 3C are views illustrating steps (step 4 through step 5) for manufacturing a printed wiring board according to the foregoing embodiment of the present invention.
Figure 3B:
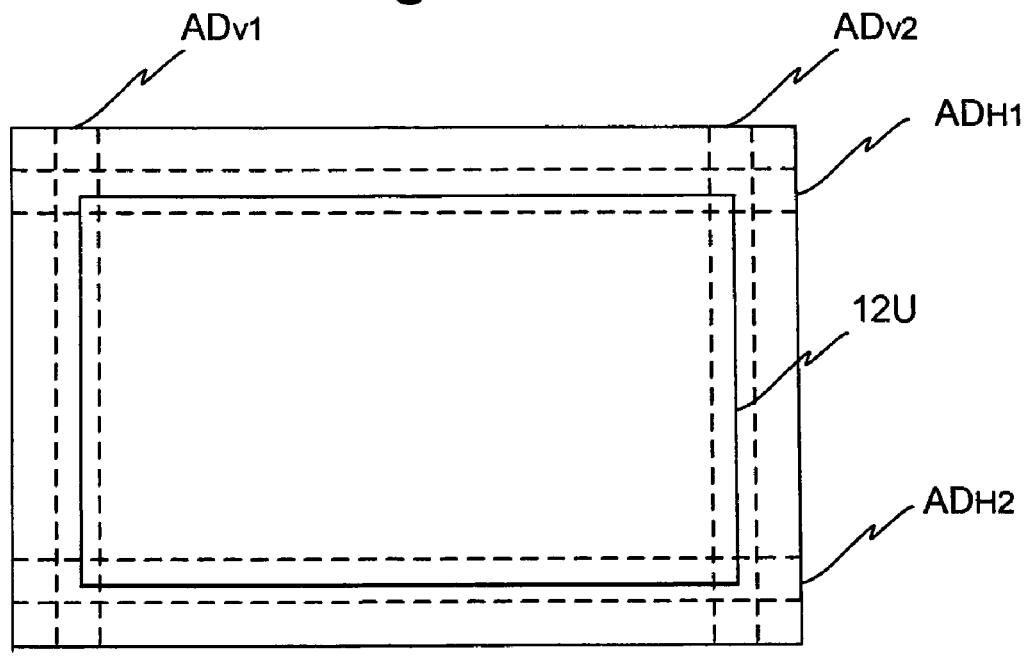

Next, as shown in FIGS. 3A and 3B, to overlap bonded portions (AD), etching resists (12U, 12L) are formed. FIG. 3B is a plan view of the laminate after etching resist (12U) is formed. Etching resist (12U) is formed to partially overlap ultrasonic welding portions (AD). To form such a resist, a commercially available dry film resist or liquid resist may be used.

Figure 3C:
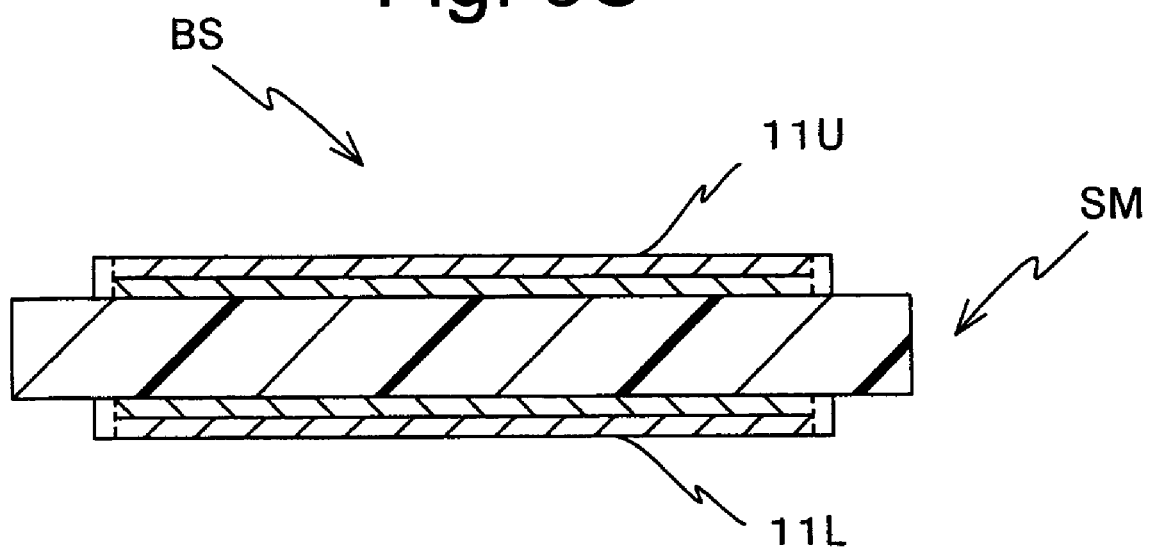

Then, peripheral portions of conductive layers (FU, FL) and metal foils (11U, 11L), which are positioned at the edges of the support member, are removed respectively by etching or the like using a known method. After that, according to a standard method, the etching resist is removed (see FIG. 3C).

Each second surface of two metal foils (11U, 11L) is preferred to be made matted, not smooth, and if required, it may be roughened. If the second surface of the metal foil is smooth, it is preferred to be roughened to enhance adhesiveness with the later-described resin insulation layer. For such a roughening treatment, a black oxide treatment using an alkaline solution or etching using a proper etching solution may be conducted. As for the etching solution, the micro etching solution "CZ series" (made by Mec Co., Ltd., located in Amagasaki, Hyogo) or the like may be used. Accordingly, mother material (BS) is formed (see FIG. 3C).

Figure 4A:
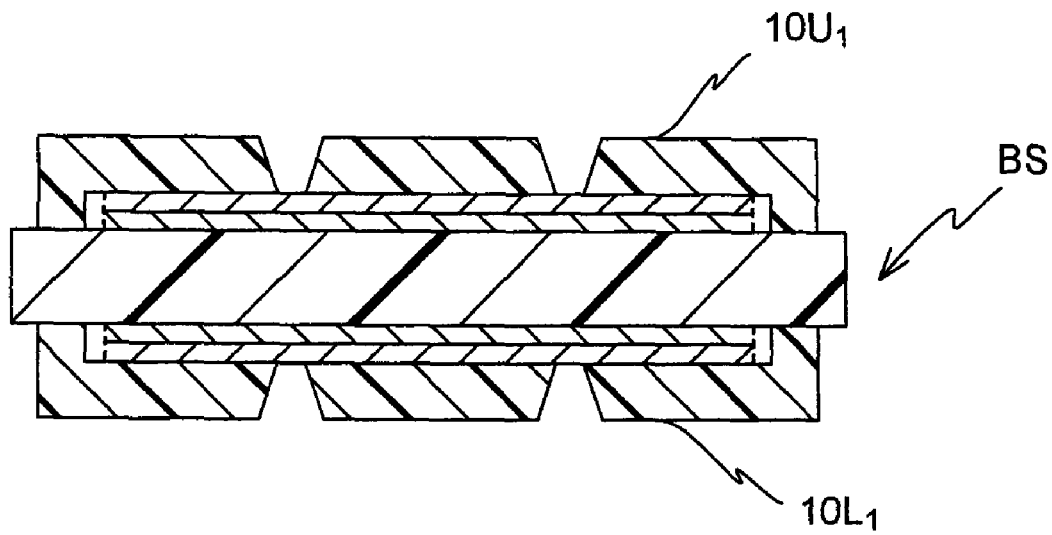
FIGS. 4A through 4B are views illustrating steps (step 6 through step 7) for manufacturing a printed wiring board according to the foregoing embodiment of the present invention.

Next, to form a resin insulation layer on each second surface (matted surface) of metal foils (11U, 11L) laminated on mother material (BS), the first surface of resin insulation layer ($10U_1$, $10L_1$) is laminated (see FIG. 4A). As for the resin insulation layer, a film or prepreg for interlayer insulation or other half-cured resin sheets may be used. Instead of using such a half-cured resin sheet, a resin insulation layer may be formed by screen-printing an uncured liquid resin on the metal foil. Either way, through thermosetting, an interlayer resin insulation layer (uppermost resin insulation layer $10L_1$ or $10U_1$) is formed (see FIG. 4A).

As for a film for such interlayer resin insulation, for example, an interlayer film for build-up wiring boards, "ABF series" (made by Ajinomoto Fine-Techno Co., Inc., located in Kawasaki, Kanagawa), may be listed. As for prepreg, varieties of products made by Hitachi Chemical Co., Ltd. may be used.

The thickness of the resin insulation layer is preferred to be made in the range of approximately 30 μm to approximately 100 μm. All the resin insulation layers are preferred to be formed with resin and filling material (excluding glass cloth and long glass fiber). Especially, if printed wiring board 100 contains five or more resin insulation layers, all the resin insulation layers preferably contain filling material (excluding glass cloth and long glass fiber). As for the filling material, inorganic filler is preferred, and if a glass fabric is used, it is preferred to be made of short fiber.

If printed wiring board 100 contains four or fewer resin insulation layers, among all the resin insulation layers, one or two are preferably resin insulation layers containing core material, such as glass cloth or long glass fiber, and resin; and the rest of the resin insulation layers are preferably resin insulation layers containing filling material, excluding glass cloth and long glass fiber, and resin.

Next, as shown in FIG. 4A, in resin insulation layers ($10U_1$, $10L_1$), openings for via holes are formed by a laser. As for a laser to be used for forming openings, a carbon dioxide gas laser, excimer laser, YAG laser or UV laser may be listed. When forming openings by a laser, a protective film such as a PET (polyethylene terephthalate) film may be used.

Next, to enhance adhesiveness with a conductive layer, the surface of a resin insulation layer is preferred to be roughened. Roughening the surface of a resin insulation layer is conducted, for example, by immersing it in a potassium permanganate solution. Next, catalytic nuclei are formed on the surface of the resin insulation layer.

Figure 4B:
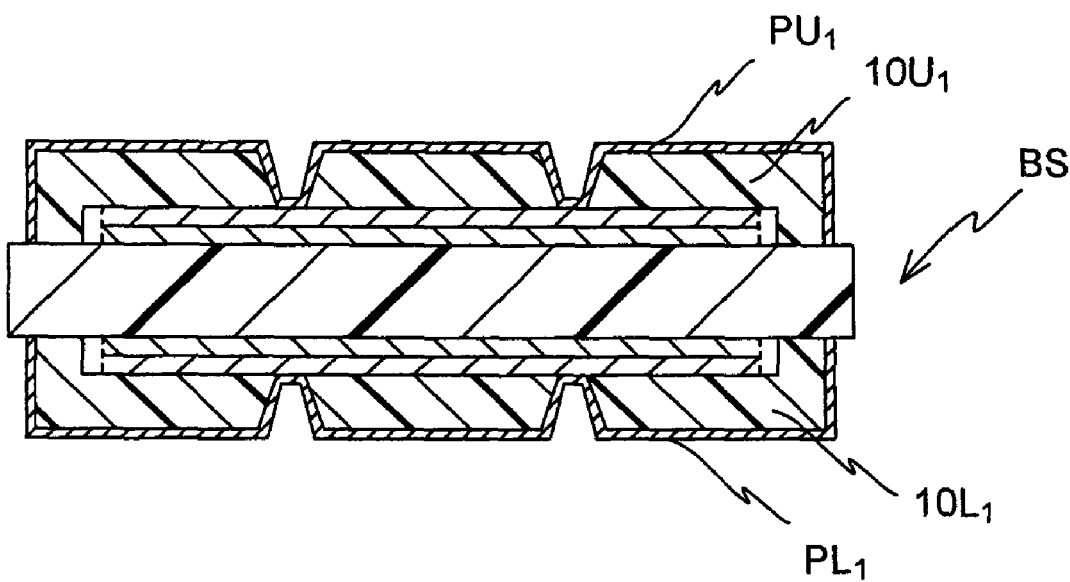

Then, as shown in FIG. 4B, by electroless plating using a commercially available plating bath, thin electroless plated films ($PU_1$, $PL_1$) with a thickness of approximately a few μm are formed. As for the electroless plated films formed here, electroless copper-plated films are preferred.

Figure 5A:
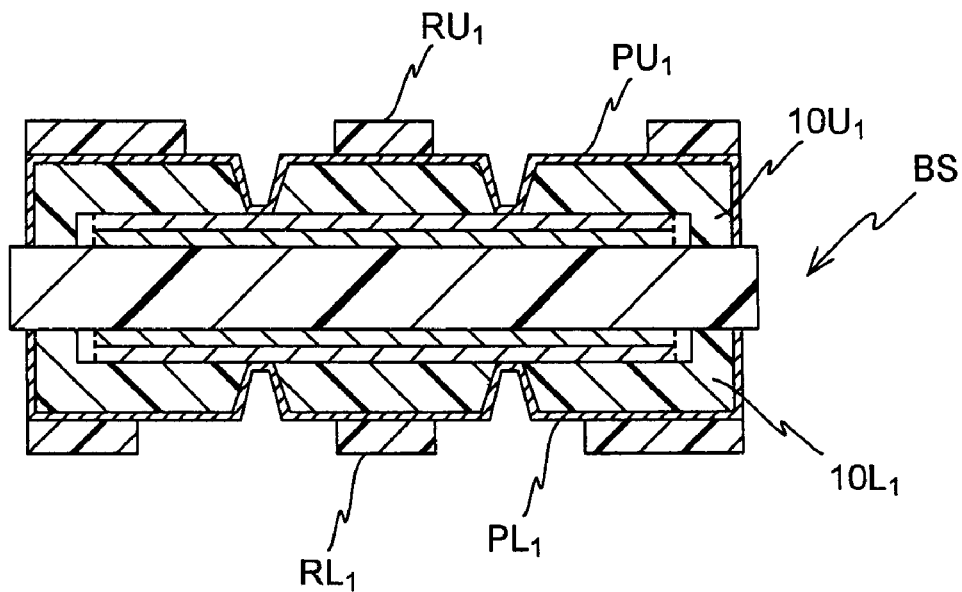
FIGS. 5A through 5B are views illustrating steps (step 8 through step 9) for manufacturing a printed wiring board according to the foregoing embodiment of the present invention.

Next, as shown in FIG. 5A, on the electroless plated films, plating resist patterns ($RU_1$, $RL_1$) are formed. Plating resist patterns ($RU_1$, $RL_1$), formed in the areas excluding the later-described via-conductor forming region and conductive-circuit forming region, may be formed, for example, by laminating a dry film for plating resist, exposing it to light and then developing it.

Next, electrolytic plating is performed to form electrolytic plated films with a thickness of approximately 5 to approximately 20 μm in the area where the plating resists are not formed. Accordingly, conductive circuits and via conductors are formed. The via conductors to be formed here are preferred to be so-called filled vias, namely vias filled in the openings formed in the resin insulation layers. Also, the top surfaces of the via conductors are preferably positioned on the same level with the top surfaces of the conductive pattern formed on the same resin insulation layer.

Figure 5B:
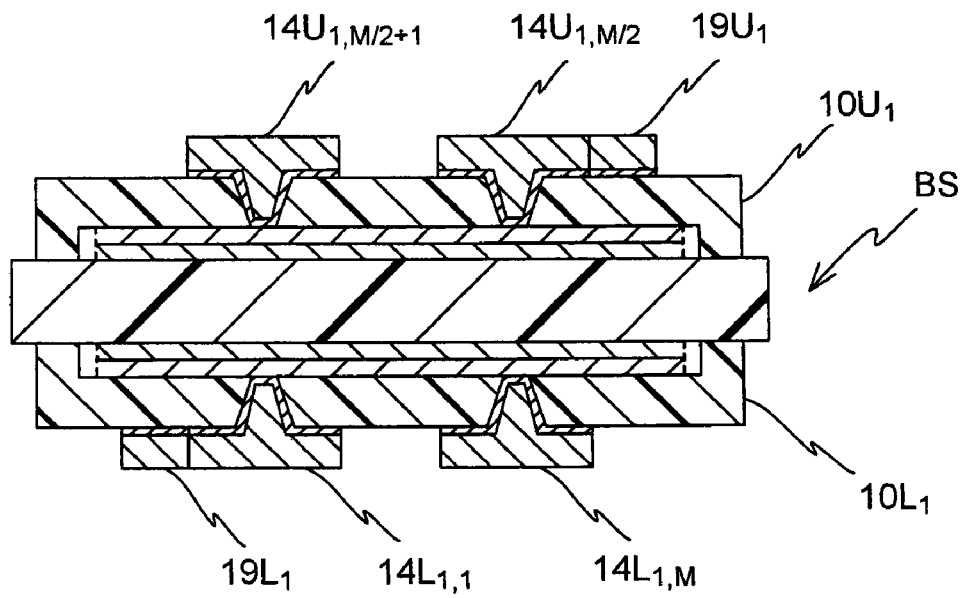

Next, the plating resists are removed. Then, as shown in FIG. 5B, the electroless plated films exposed by the removal of the above resist patterns are removed to form conductive circuits (19U, 19L) and via conductors (14U, 14L). Here, to remove the electroless plated films, since the electroless plated films are thin, etching without using etching resist (hereinafter, may be referred to as "quick etching") may be conducted.

Such quick etching is conducted, for example, by using a hydrogen peroxide/sulfuric acid type etching solution.

Through the above steps, the first-layer resin insulation layer (the uppermost resin insulation layer), the first-layer conductive layer and via conductors are formed (see FIG. 5B). Here, the first-layer conductive circuit is formed on the second surface of the uppermost resin insulation layer. The surfaces of the conductive pattern (conductive circuit) and via conductors are preferred to be roughened.

Next, to form the second-layer resin insulation layer, the first surface of the above-described half-cured resin sheet is laminated on the second surface of the uppermost resin insulation layer and on the first conductive layer. Then, by repeating the steps shown from FIG. 4A to FIG. 5B, the second-layer resin insulation layer and second-layer conductive layer and via conductors are formed. Likewise, the steps from forming a resin insulation layer to forming via conductors and a conductive pattern are repeated to obtain laminates (17U, 17L) where a required number of resin insulation layers and conductive layers are alternately laminated (see FIG. 6A).

In the following, on the outermost resin insulation layers ($10U_N$, $10L_N$) (the lowermost resin insulation layers) of each laminate (17U, 17L) and on conductive circuits ($19U_N$, $19U_N$) and via conductors ($14U_{N,\ M/2+1}$, $14U_{N,\ M/2}$, $14L_{N,\ M/2+1}$, $14L_{N,\ M/2}$) formed on the second surface of the lowermost resin insulation layers, solder resists (20L, 20U) are formed. Here, the surfaces of the lowermost resin insulation layers and the surfaces of the conductive circuits formed on the second surfaces of the lowermost resin insulation layers are all preferred to be roughened.

Here, roughening the surfaces of resin insulation layers and roughening the surfaces of the conductive circuits are preferably conducted separately. For example, to roughen the surfaces of the above resin insulation layers, the laminates formed in the above are immersed in a potassium permanganate solution. Also, to roughen the above conductive circuits, the above-described "CZ series" micro etching solution may be used.

Figure 6A:
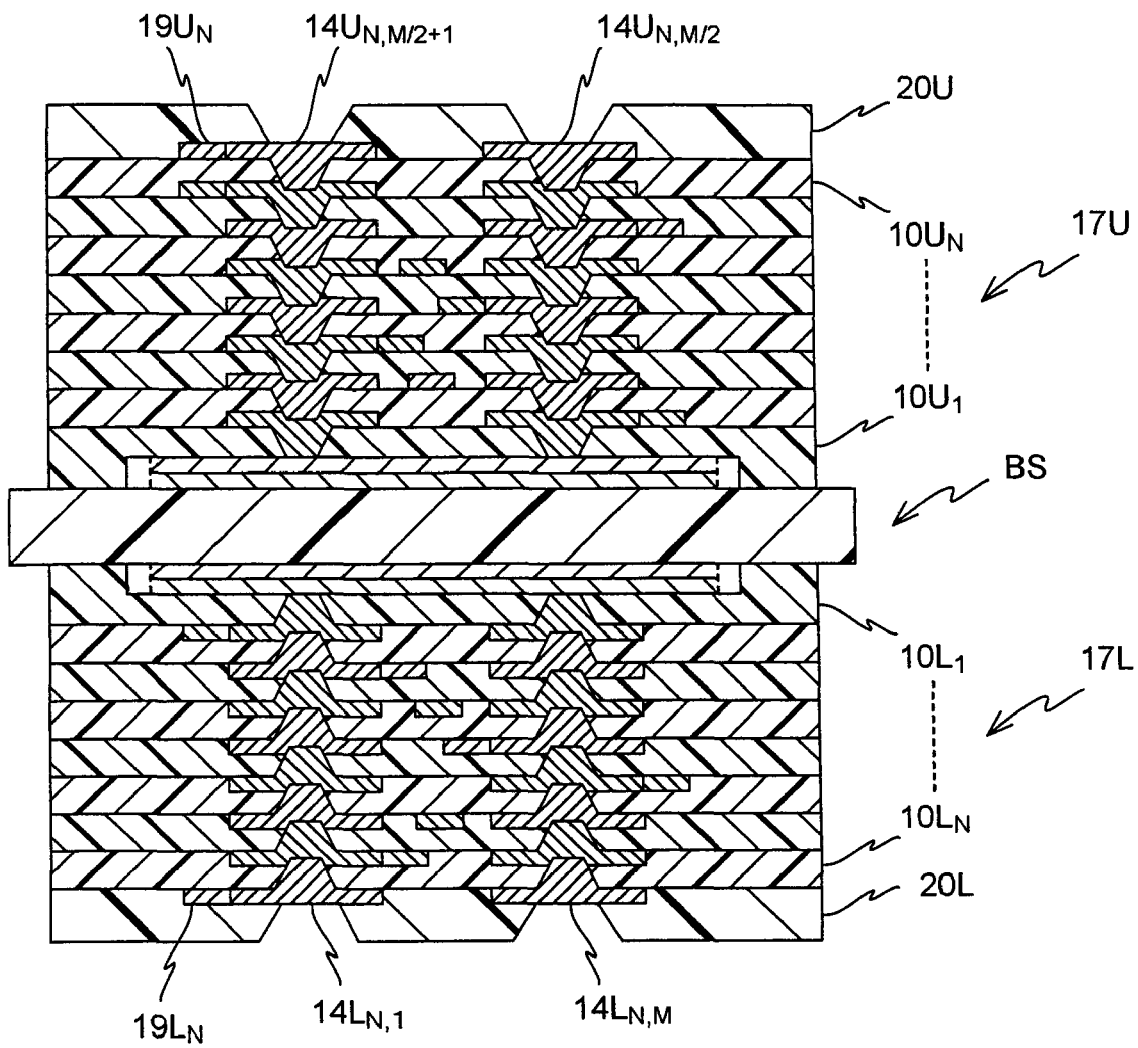
FIGS. 6A through 6B are views illustrating steps (step 10 through step 11) for manufacturing a printed wiring board according to the foregoing embodiment of the present invention.
Figure 6B:
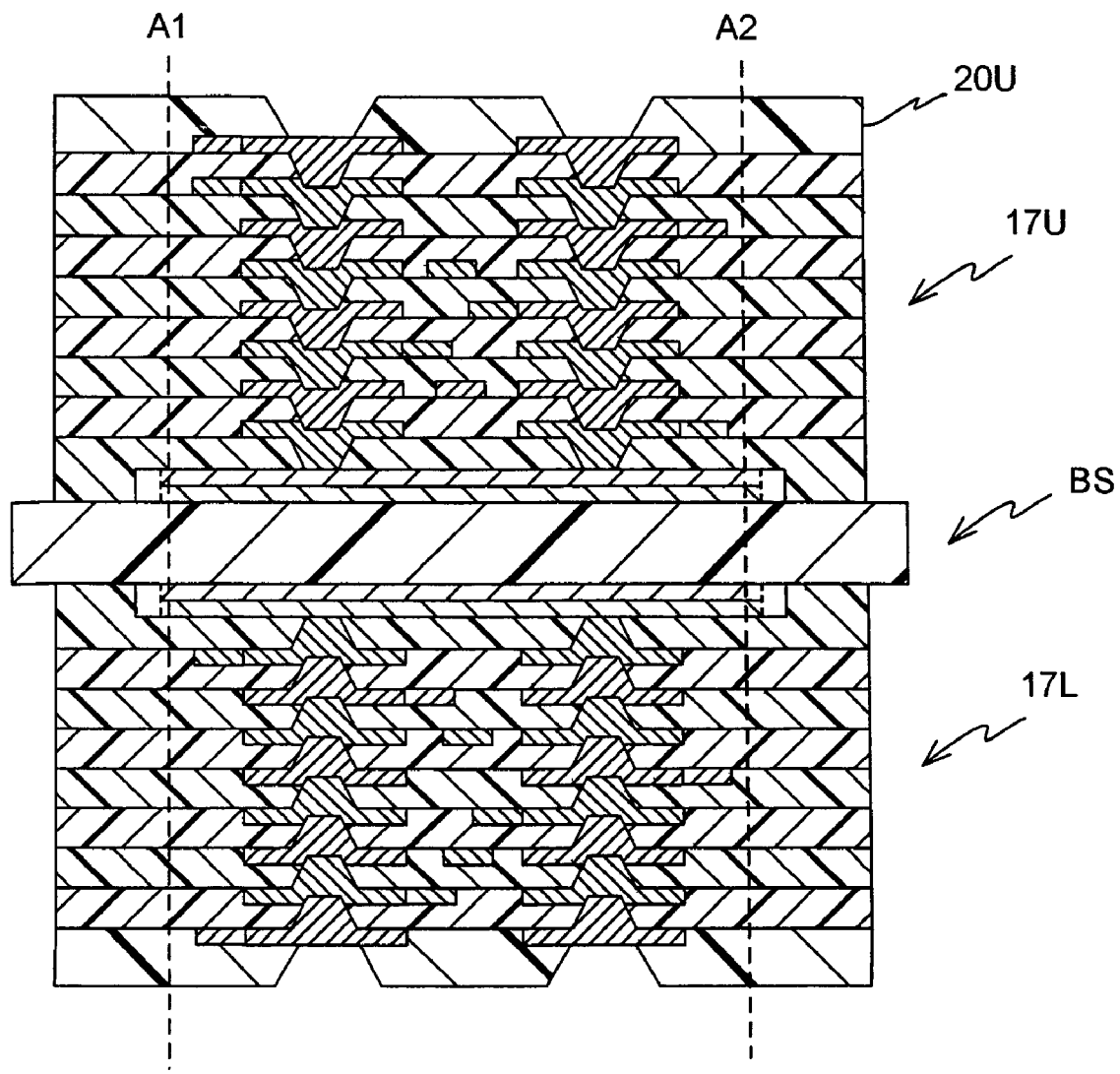

Next, by exposing to light and developing the solder resist, openings to expose the surfaces of conductive circuits ($19U_N$, $19U_N$) and via conductors ($14U_{N,\ M/2+1}$, $14U_{N,\ M/2}$, $14L_{N,M/2+1}$, $14L_{N,M/2}$) are bored (see FIG. 6A). The surfaces of the conductive circuits and via conductors exposed through the openings in solder resists become the second pads (second external connection terminals). Then, on the second external connection terminals (second pads), solder members (solder bumps) or pins are formed, through which electrical connection is made to other substrates.

Here, openings formed in the solder resists may be formed so as to expose the surfaces of via conductors and portions of the conductive circuits (via lands) connected to the via conductors. In such a case, portions of the conductors exposed through the openings in the solder resist will structure the second pads.

Next, laminate (17U), which is structured with metal foil (11U), multiple resin insulation layers ($10U_1 \sim 10U_N$), multiple conductive layers ($19U_1 \sim 19U_N$), ($14U_{1,1} \sim 14U_{N,M/2+1}$), ($14U_{1,\ 2} \sim 14U_{N,\ M/2}$) and solder resist (20U), and laminate (17L), which is structured with metal foil (11L), multiple resin insulation layers ($10L_1 \sim 10L_N$), multiple conductive layers ($19L_1 \sim 19L_N$), ($14L_{1,\ 1} \sim 14L_{N,\ M/2+1}$), ($14L_{1,\ 2} \sim 14L_{N,\ M/2}$) and solder resist (20L), are cut along cutting lines (A1, A2) arranged inside the portions (AD) bonded by ultrasound (see FIG. 6B), so as to remove them from support member (SM) respectively. By doing so, the above two laminates are removed from support member (SM).

Figure 7A:
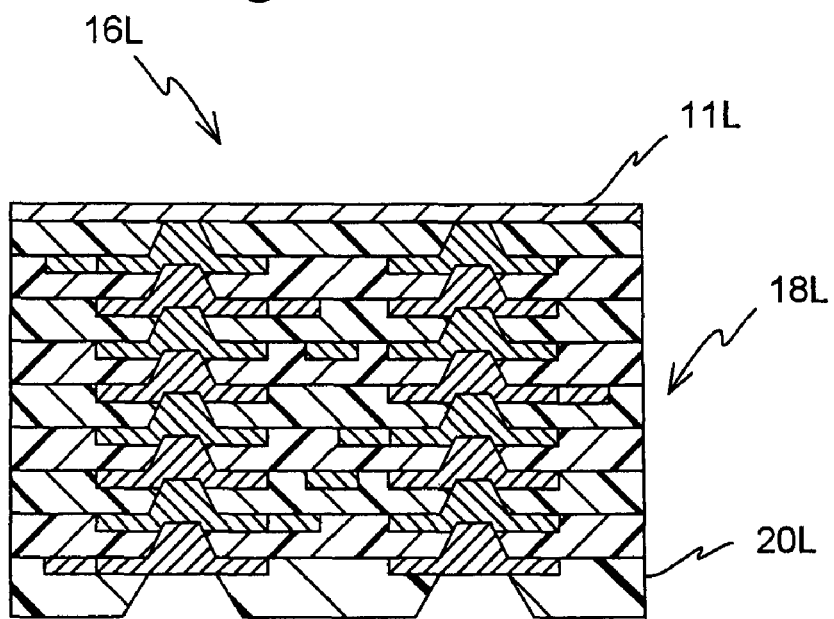
FIGS. 7A through 7B are views illustrating steps (step 12 through step 13) for manufacturing a printed wiring board according to the foregoing embodiment of the present invention.
Figure 7B:
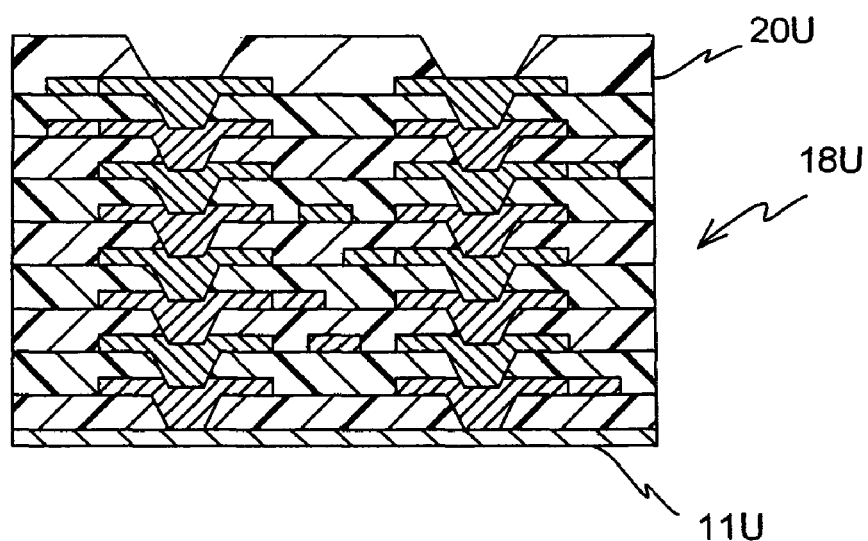

As a result, intermediate substrate (18L) shown in FIG. 7A and intermediate substrate (18U) shown in FIG. 7B are obtained. As such, intermediate substrates (18U, 18L) formed simultaneously on both surfaces of support member (SM) may be obtained simultaneously.

In the following, steps to form printed wiring board 100 from intermediate substrate (16L) are described. On intermediate substrate (16L) removed from support member (SM), the surface opposite where solder resist (20L) is formed (the first surface of the uppermost resin insulation layer) is covered by metal foil (11L) (see FIG. 7A).

Figure 8A:
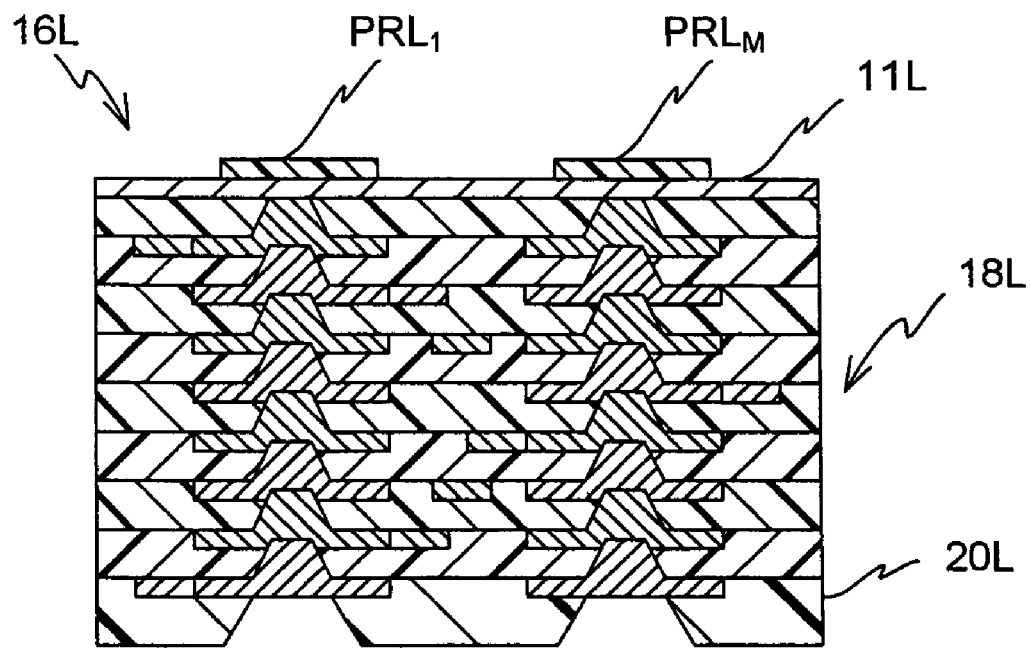
FIGS. 8A through 8C are views illustrating step (step 14 through step 16) for manufacturing a printed wiring board according to the foregoing embodiment of the present invention.

On metal foil (11L), a dry film resist for etching is laminated, and, using a proper mask, is exposed to light and developed. Accordingly, resist patterns ($PRL_1 \sim PRL_N$) are formed (see FIG. 8A).

Figure 8B:
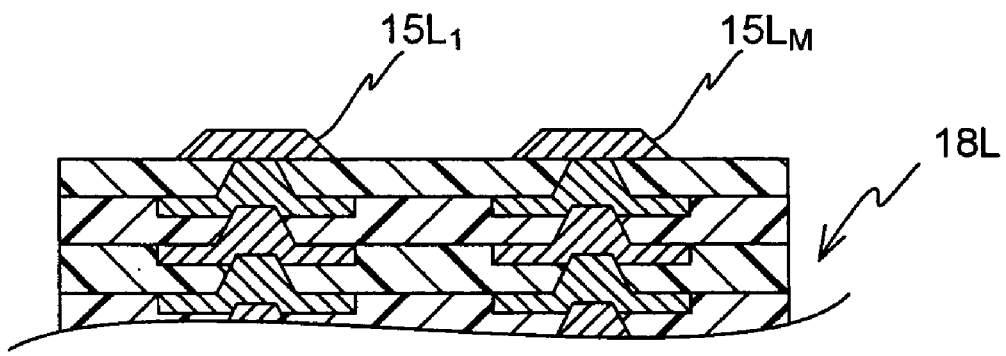

Next, as shown in FIG. 8B, using an etching solution (an etchant) containing copper (II) chloride or iron (II) chloride, portions of the metal foil, which exclude the area where the resist pattern is formed, are removed to form first pads ($15L_k$, k=1~M) on the first surface of the uppermost resin insulation layer. By forming component-loading pads (first pads) from the metal foil, uniform thickness of each pad may be easily achieved. Also, since the first pads are formed using the resist as an etching mask, unlike conventional methods, the electrolytic plating layer may be prevented from protruding beyond the pad at its top surface.

Here, to protect the second external connection terminals from the etchant, the surface of the solder resist and the openings are preferred to be covered by the above-described resist.

On the surfaces of first pads ($15L_k$) (including the side surfaces of the first pads) formed above, a protective film formed with one or more layers of electroless plated films is formed. When forming a one-layer protective film, for example, electroless Au-plated film or electroless Pd-plated film is formed on the pads. When forming a two-layer protective film, for example, electroless nickel-plated film and then electroless gold-plated film are formed on the pads in that order. When forming a three-layer protective film, between the above electroless nickel-plated film and electroless gold-plated film, an electroless Pd-plated film is formed.

Before forming a protective film on the first pads, the resist on the solder resist is removed and a protective film is formed on the second external connection terminals.

On the surfaces of first pads (first external connection terminals) ($15L_k$) and the second pads (second external connection terminals), instead of a protective film made of electroless plated film, a water-soluble OSP film (Organic Solderability Preservative) may be formed. By forming a protective film or an OSP film, corrosion prevention and solderability may be enhanced.

When an OSP film is formed on a pad, since the OSP film is a very thin single-molecular film, the thickness of a component-loading pad structured with a component-loading pad (first pad) and the protective film practically equals the thickness of the above component-loading pad. Furthermore, after the component-loading pads are formed, a protective film is formed on their surfaces, and thus, the protective film formed on the top surfaces of the pads is prevented from protruding beyond the pads.

Next, on first pads ($15L_k$), for example, solder paste is printed by screen-printing. Since the above component-loading pads (first pads) are shaped truncated as described above, a protective film is formed on all surfaces of the pads (top surfaces and side walls). Therefore, solder members (solder bumps) get wet and spread over the top surfaces and side walls of the first pads. Then, via the solder bumps formed on the first pads, for example, an electronic component such as an IC chip is mounted.

Figure 8C:
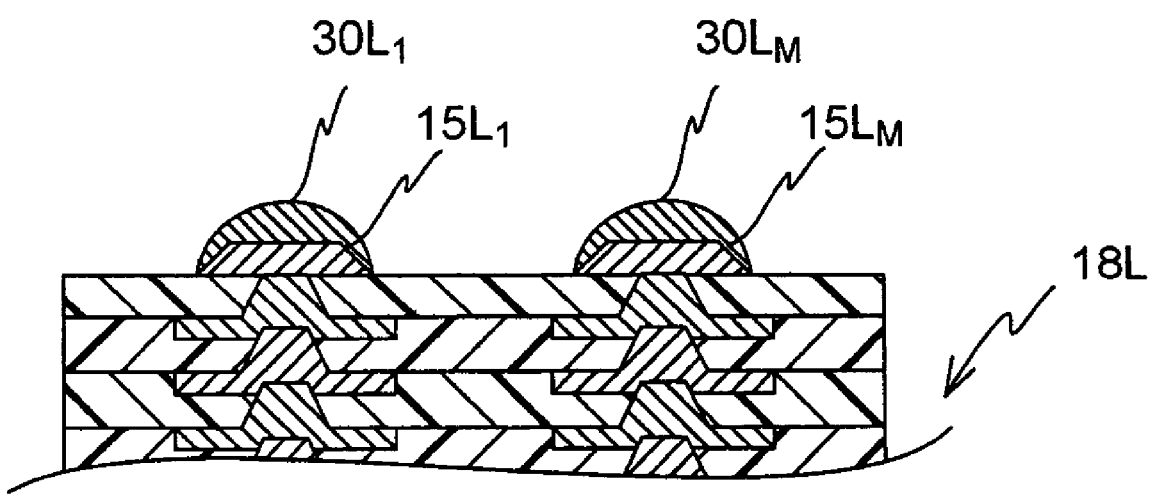

Next, as shown in FIG. 8C, by conducting a reflow process, solder bumps ($30L_k$) are formed to mount an IC chip or the like.

On the second pads, solder bumps are formed in the same manner as above to connect to, for example, another substrate such as a mother board. Accordingly, a printed wiring board according to an embodiment of the present invention is manufactured. In the above-described printed wiring board according to an embodiment of the present invention, on the uppermost resin insulation layer and the first pads, solder resist having openings to expose the first pads may be formed.

Also, the first pads may be arranged on the uppermost resin insulation layer ($10L_1$) as shown in FIG. 9, and then connected with each other by inner conductive circuit ($44L_{n+1}$). When forming the first pads as such, PAL shown in FIG. 10 becomes a pad-forming region (pad-forming region for component-loading pads). Those pads formed as above may be used as, for example, $30L_n$ for signals, $32L_{n+1}$ for ground and $31L_{n+1}$ for power supply. Here, the pad-forming region for component-loading pads is a region which is shaped rectangular (includes both square and rectangle) or circular (includes both circle and ellipse) with a minimum area to include all the pads.

As shown in FIG. 9, component-loading pads include power-supply component-loading pads and ground component-loading pads. In the pad-forming region for component-loading pads, it is preferred that at least either inner conductive circuit for power supply ($41L_n$) to electrically connect power-supply component-loading pads, or inner conductive circuit for ground ($41L_{n+1}$) to electrically connect ground component-loading pads be formed.

Figure 10:
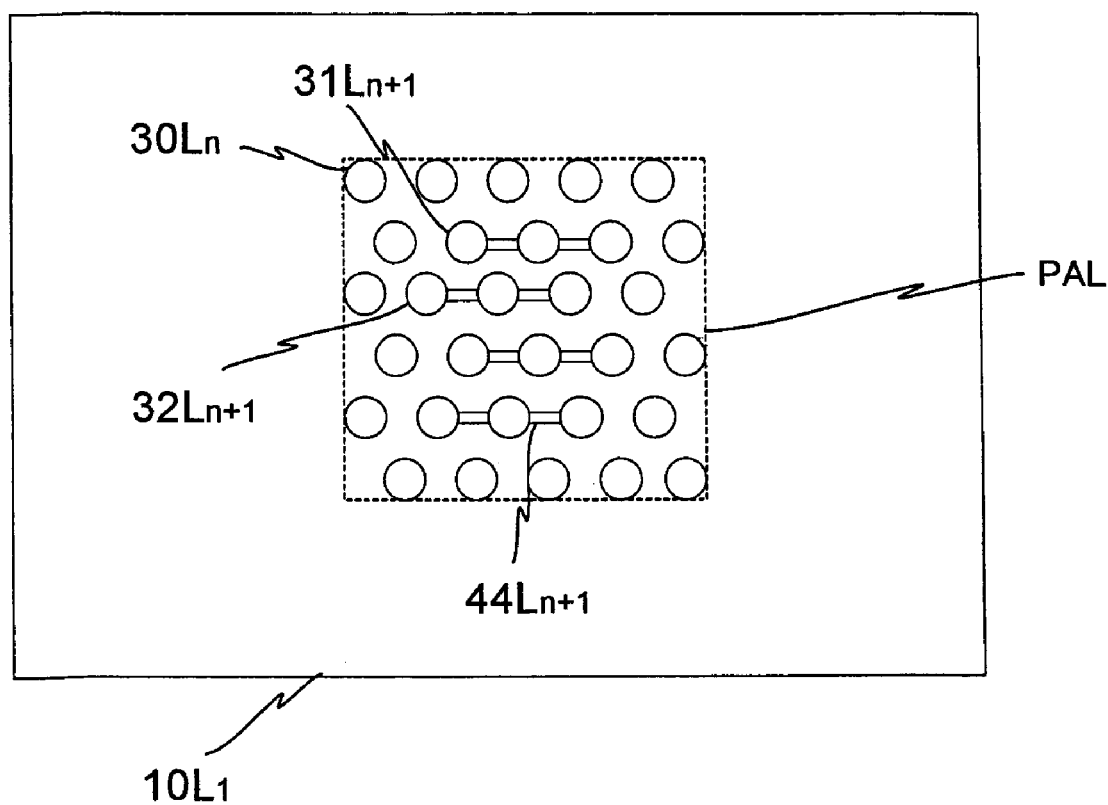
FIG. 10 is a schematic view (view 2) illustrating a pad-forming region arranged on the outermost layer of a printed wiring board according to an embodiment of the present invention, pads formed in the pad-forming region, and wiring between the pads.
Figure 11:
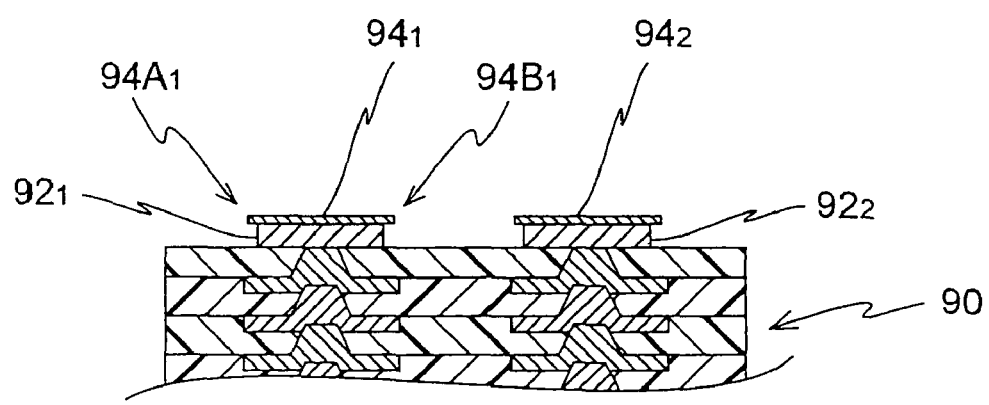
FIG. 11 is a cross-sectional view illustrating a printed wiring board and pads manufactured by a conventional method.

FIG. 10 is a view of the uppermost resin insulation layer seen from above. As shown in the illustration, in the printed wiring board according to an embodiment of the present invention, on the uppermost resin insulation layer a conductive circuit to be drawn from the pads is preferred not to be extended toward the periphery of the substrate. It is preferred that the component-loading pads arranged on the uppermost resin insulation layer be formed in the pad-forming region; and that in the region excluding the pad-forming region, the surface of the uppermost resin insulation layer be exposed.

The above-described printed wiring board according to an embodiment of the present invention does not have a core substrate such as a conventional example does. Generally, without a core substrate, the rigidity of a printed wiring board may be lowered, or the thermal expansion coefficient may become large. As a result, on the solder bumps connecting an electronic component and the printed wiring board, large stress may be exerted, causing problems with connection reliability.

However, in the above-described printed wiring board according to an embodiment of the present invention, since solder bumps are formed on the top surfaces and side walls of the first pads, the bonding strength between the solder members and the component-loading pads is enhanced. Accordingly, the solder members are seldom removed from the component-loading pads. Thus, without a core substrate, connection reliability with an IC chip would not be disrupted. At least the side surfaces of the first pads (component-loading pads) are preferred to be roughened, because the adhesive strength between the pads and the solder bumps is further enhanced.

Also, when a pad has a rectangular cross-section, if a solder bump is formed even on the side surfaces of the pad, the distance between solder bumps becomes shorter. However, the cross-section of the component-loading pad (seen in the direction perpendicular to the surface of the uppermost resin insulation layer) is truncated as shown in FIG. 8B. Thus, if a solder bump is formed on the side walls of the first pad, the distance between adjacent solder bumps may remain large.

Also, the surface of the uppermost resin insulation layer is roughened as described above. Thus, the wettability of the underfill improves and the filling performance of the underfill is enhanced. Accordingly, the adhesive strength between the underfill and the uppermost resin insulation layer may be enhanced.

EXAMPLES

In the following, examples of the present invention are described in detail. However, the present invention is not limited to those examples.

Example 1

Manufacturing a Printed Wiring Board (1) Manufacturing Mother Material (BS)

As for support member (SM), double-sided copper-clad laminate (SM) (product number: MCL-E679 FGR, made by Hitachi Chemical Co., Ltd.), where 18 μm-thick copper foils (FU, FL) are laminated on both surfaces of 0.4 mm-thick glass epoxy board, was used (see FIG. 2A).

Next, as shown in FIG. 2A, on both surfaces of double-sided copper-clad laminate (SM), the first surfaces of 18 μm-thick copper foils (11U, 11L) were laminated. One surface of copper foils (11U, 11L) was matted (roughened surface), and the second surface was designated as a matted surface (roughened surface). Next, a horn of ultrasound bonding equipment was set so as to bond the copper foil and the double-sided copper-clad laminate at the positions 20 mm inside from each edge. Then, under the following conditions, the horn was moved along the four sides to bond the copper-clad laminate and the copper foil (see FIGS. 2C and 2D).

horn amplitude: approximately 12 μm
number of oscillations of horn: f=28 kHz/sec.
pressure of horn exerted on copper foil: p=approximately 0-12 kgf
feed rate of horn along copper foil: v=approximately 10 mm/sec.

FIGS. 2B and 2C show the secured portions of the double-sided copper-clad laminate and the metal foil. The secured portions are located 20 mm inside from each edge of the metal foil toward the center, and the width of the secured portions is 2 mm.

Next, on the metal foil, using a commercially available product, etching resists were formed, then exposed to light and developed. Then, as shown in FIGS. 3A and 3B, the etching resists were patterned to overlap the bonded portions (AD).

Next, through a tenting process using an etching solution containing copper (II) chloride or others, portions of copper foils (FU, 11U) and (FL, 11L) where etching resists were not formed were removed. Then, according to a standard method, the etching resists were removed and mother material (BS) was manufactured.

(2) Forming a Laminate Through a Build-Up Process

On both surfaces (the second surface of the metal foil) of mother material (BS) manufactured as above, an interlaminar film for build-up wiring ("ABF series," made by Ajinomoto Fine-Techno Co., Inc.) was laminated and thermoset at about 170° C. for 180 minutes. Accordingly, resin insulation layers (the uppermost resin insulation layers) (10U, 10L) were formed. Then, as shown in FIG. 4A, openings for via holes were formed using a carbon dioxide gas laser.

Next, the surfaces of the resin insulation layers were roughened by using a 50 g/L potassium permanganate solution at 50-80° C. for 1-5 minutes. Then, electroless copper plating was performed using a commercially available plating bath to form electroless copper-plated films (chemical copper-plated films) with a thickness in the range of approximately 0.3-1 μm as shown in FIG. 4B.

Next, a commercially available dry film was laminated. After that, as shown in FIG. 5A, plating resists were patterned by a photographic method.

Electrolytic copper plating was performed using the electroless copper-plated films formed on the resin insulation layers as electrodes to form 5-20 μm-thick electrolytic copper-plated films on the electroless copper-plated films where the plating resists were not formed. Then, the plating resists were removed.

Next, as shown in FIG. 5B, the electroless copper-plated films located between the electrolytic copper-plated films were removed to form conductive circuits and via conductors. Here, the via conductors were formed so as to fill the openings formed in the resin insulation layers and to make their top surfaces flush with the top surfaces of the conductive patterns formed on the same resin insulation layers.

The above steps were repeated eight times to form laminates (17U, 17L) having eight (8) resin insulation layers and eight (8) conductive layers (see FIG. 6A).

(3) Forming the Second External Connection Terminals (Second Pads)

In laminates (17U, 17L) structured with eight layers, the surfaces of the lowermost resin insulation layers ($10U_N$, $10L_N$) (the resin insulation layers formed opposite the support board) and the surfaces of the conductive patterns formed on the resin insulation layers were roughened. To roughen the surfaces of the resin insulation layers, the laminates formed here were immersed in a potassium permanganate solution. Also, to roughen the conductive circuits, the above-described "CZ series" was used.

Next, on the lowermost interlayer resin insulation layers and the conductive circuits formed on the lowermost interlayer resin insulation layers, solder resists (20U, 20L) were formed using a commercially available product. Then, masks were laminated on the solder resists, and openings were formed by a photolithographic method in solder resists (20U, 20L). The surfaces of the via conductors and the surfaces of the conductive patterns exposed through the openings were made into the second external connection terminals (see FIG. 6A).

(4) Removing from Support Member (SM) and Forming the First External Connection Terminals (First Pads)

The cutting sections were set so as to position just inside the bonded portions (see A1 and A2 in FIG. 6B), and cutting was conducted at those sections. Then, laminates (17U, 17L) were removed from support member (SM) to make intermediate substrates (18U, 18L) respectively.

On copper foil (11L) of laminate (18L) which was removed from support member (SM) and exposed, a commercially available dry film for etching resist was laminated. Then, the etching resist was patterned by a photographic method (see FIG. 8A).

To protect the second pads formed in solder resist (20L) from the etchant, an etching resist the same as above was laminated to cover the entire surface of solder resist (20L) and the openings.

Next, using an etching solution containing mainly copper (II) chloride and under a spraying pressure of 0.3-0.8 MPa, etching was conducted to remove the portions of the copper foil where the etching resist was not formed. The first pads were formed accordingly. The configuration of first pads $15L_k$ (k=1~M) was made truncated, as shown in FIG. 8B, where the area of the bottom surface which was in contact with the first surface of uppermost resin interlayer insulation layer ($10L_1$) was larger than the area of the top surface on which to mount an electronic component.

Also, as described above, the uppermost insulation layer was formed on the roughened surface of the copper foil. Therefore, after the copper foil was removed by etching, on the first surface of the uppermost resin insulation layer, a roughened surface copied from the roughened surface of the copper foil was formed.

Next, as shown in FIG. 8B, the etching resist was removed to form a group of pads containing multiple component-loading pads (first pads). Since component-loading pads (first pads) were formed from metal foil (11L), the thickness of each pad was made substantially uniform. Also, since the first pads were formed using the resist as an etching mask, at the top surface of a pad an electrolytic-plated layer protruding beyond the pad was not formed.

(5) Processing the Surfaces of the Pads

After the first pads were formed, the surfaces of each first pad and second pad were processed by an OSP (Organic Solderability Preservative) to form a protective film. By doing so, a very thin single-molecular film was formed on the pads, and the thickness of a component-mounting pad structured with the component-loading pad (first pad) and the protective film was practically equal to the thickness of the pad. Also, after the first pads were formed, a protective film was formed on their surfaces, and thus the protective film formed on the top surface of a pad was prevented from protruding beyond the pad.

(6) Forming Solder Bumps

Next, as shown in FIG. 8C, by a screen printing method, solder paste was printed on the first pads and second pads and processed by a reflow to form solder bumps on the above first and second pads (solder bumps on the second pads were omitted in FIG. 8C). Since a protective film was formed on the entire surface of the first pads (top surfaces and side walls), the solder bumps get wet and spread over the top surfaces and side walls to be formed.

Although the embodiment of the present invention does not have a core substrate, since solder bumps were formed on the top surfaces and side walls, the bonding strength between the solder bumps and the first pads was enhanced. Accordingly, the solder bumps were seldom removed from the first pads. Also, since the cross-sectional configuration of the first pads was truncated, the distance between adjacent solder bumps is substantially the same as the distance between the pads, thus remaining large.

Also, in Example 1, on the uppermost resin insulation layer and on the first pads, a solder resist having openings to expose the first pads was not formed. Therefore, in contrast with a printed wiring board which has a solder resist, the distance between the surface of the uppermost resin insulation layer and an IC chip was large. As a result, underfill performance to seal between the IC chip and the printed wiring board was improved.

Also, since the surface of the uppermost resin insulation layer was roughened as described above, the wettability of the underfill was improved and the filling performance of the underfill was enhanced. Accordingly, adhesive strength between the underfill and the uppermost resin insulation layer improved.

Example 2

For support member (SM), a double-sided copper-clad laminate, where 5 μm-thick copper foil (FU, FL) is laminated on both surfaces of 0.4 mm-thick fiber-reinforced plastics, was used as substrate (SM). On copper foil (FU, FL), a copper foil was secured by an epoxy-type adhesive agent. The rest was the same as in Example 1 to form a printed wiring board.

Example 3

In Example 1, on both first and second pads, an OSP film was formed as a protective film. In contrast, in this example, on the surfaces of both first and second pads, an electroless nickel-plated film and an electroless gold-plated film were formed in this order as a protective film. On the top surfaces and side walls, this protective film was formed.

The rest was the same as in Example 1 to form a printed wiring board. In this example, to achieve a uniform thickness of the protective film formed on each first pad, a protective film was formed not by electrolytic plating, but by electroless plating. Also, electronic component-mounting pads were structured with electronic component-loading pads and a protective film formed with an electroless plated film. As a result, the distance between electrodes of an electronic component and electronic component-mounting pads became uniform.

Example 4

Copper foils (11U, 11L) used in Example 1 to form the first pads were changed. In this example, a copper foil whose first surface was smooth and whose second surface was matted was used. Also, the side surfaces of the first pads were roughened after the first pads were formed but before the etching resist was removed. The rest was the same as in Example 1 to form a printed wiring board. As a result, the first pads in Example 4 had smooth top surfaces and roughened side walls.

Example 5

A protective film formed in Example 1 was formed neither on the first pads nor on the second pads. Since the first pads were formed only with a copper foil, the thickness of each first pad was uniform. As a result, uniform distance between each electrode of an electronic component such as an IC and each first pad, as well as a reduced amount of solder for use to form solder bumps, was achieved. Accordingly, a reduction in the connection resistance between the printed wiring board and the electronic component was realized.

Example 6

In Example 5, to enhance the bonding strength between solder bumps and first pads, a CZ treatment was conducted to roughen the surfaces of the first pads. Accordingly, the top surfaces and side walls of the first pads became roughened.

Example 7

In Example 6, on both first and second pads, a protective film formed with an electroless gold-plated film was formed.

Example 8

In Example 6, on both first and second pads, a protective film was formed using an OSP.

Example 9

In Example 9, a method for manufacturing a printed wiring board according to another embodiment shows how to bond support board (SM) and copper foil (11U, 11L) using techniques other than ultrasonic bonding.

According to Example 1, metal foils (11U, 11L) on the support board (SM) are bonded by using ultrasound. However, a method for bonding both metal foils (11U, 11L) is not limited to such. As long as both metal foils are adhered firmly from the first step to the step for separating both metal foils (see FIGS. 2A through 7B), other bonding methods may be used. For example, a method for firmly adhering with an adhesive agent, or a method for firmly adhering by solder may be used. When bonding the support board (SM) and metal foil (11U, 11L) with an adhesive agent, the support board (SM) may be either an insulation plate, metal plate, or a support board having a metal foil on its surface.

In Example 9, FRP (fiber reinforced plastics) is used as a support board (SM). A copper foil is laminated on the FRP, and then using an adhesive agent, the peripheral portion of the copper foil and the support board is secured. Then, following the process shown in FIG. 3C and the subsequent processes of Example 1, a printed wiring board is produced.

If an adhesive agent is used when bonding the support board and the metal foil, any agent satisfying the following requirements may be used: When processing in each step with reference to FIGS. 2C through 7B, the support board and the metal foil will not peel; when an insulation layer formed on the metal foil hardens or shrinks, the metal foil will not deform or break due to warping, snapping, bending, or distorting; and in each step with reference to FIGS. 2C through 7B, a processing solution or the like will not be contaminated.

Considering the above, resins that will not soften or melt at a processing temperature during each step in FIGS. 2C through 7B are selected.

When the support board and the metal foil are entirely bonded, an adhesive agent to be used is preferred to meet the following requirements: At temperatures lower than a range that may degrade a printed wiring board, a printed wiring board (metal foil 11U, 11L) and the support board (SM) may be separated; namely, thermoplastic resins, which do not soften or melt at a processing temperature in each step shown in FIGS. 2C through 6B (for example, 180° C.), but soften or melt at a temperature lower than a range that may degrade a printed wiring board, or at the temperature of or lower than a soldering temperature (for example, 280° C.), will be selected.

Alternately, instead of the ultrasonic bonding in Example 1, the support board (SM) and the metal foil (11U, 11L) may be bonded by solder. However, when applying solder, to avoid thermal damage on the printed wiring board area, it is preferred that solder be applied not on the entire area, but on limited areas.

According to embodiments of the present invention, by bonding the support board and the copper foil, from the first step to the step for separating printed wiring boards, the adhesiveness between the support board and the copper foil may be preserved. Accordingly, even if insulation layers harden/shrink, deformation (for example, crooking, warping, snapping, bending, etc.) or breakage of copper foil (11U, 11L) is prevented. As a result, a printed wiring board having excellent connection reliability between pads formed from the copper foil and via-conductors is produced. Also, a printed wiring board where pads formed from the copper foil seldom rupture and align accurately is produced.

As described above, a printed wiring board according to the present invention is useful as a thin-type printed wiring board. It is suitable to use for manufacturing smaller devices.

Furthermore, a printed wiring board according to the present invention is suitable to manufacture with a high yield a thin-type printed wiring board having excellent connection reliability.

A printed wiring board according to an embodiment of the present invention has: multiple resin insulation layers each having openings for via conductors; multiple conductive layers each having a conductive circuit; via conductors formed in the openings and connecting conductive circuits formed in separate conductive layers among the conductive layers; and component-loading pads to mount an electronic component formed on the uppermost resin insulation layer positioned as the outermost layer among the multiple resin insulation layers. The resin insulation layers and conductive layers are laminated alternately and the component-loading pads are formed from a metal foil.

Here, the bottom surface of the component-loading pads, which is in contact with the surface of the uppermost resin insulation layer, is preferred to be shaped truncated, and its area is larger than the area of the upper surface for mounting an electronic component. Furthermore, on the component-loading pads' upper surfaces where an electronic component is mounted, and on the side surface of the component-loading pads, solder members are preferred to be formed. Also, the side surfaces of the component-loading pads are preferred to be roughened.

In addition, in the printed wiring board, on the uppermost resin insulation layer, it is preferred that a conductive circuit drawn from the pads not be extended toward the periphery of the substrate. Furthermore, it is preferred that the component-loading pads arranged on the uppermost resin insulation layer be formed in a pad-forming region, and that in the region excluding the pad-forming region the surface of the uppermost resin insulation layer be exposed.

Moreover, on the upper surface and side surfaces of the component-loading pads, a protective film is preferred to be formed, and the interlayer resin insulation layers are preferred to be insulation layers containing filling material (excluding glass cloth and long glass fiber).

In the printed wiring board, the component-loading pads include power-supply component-loading pads and ground component-loading pads. In the component-loading pad forming region, at least either an inner conductive circuit for power supply which electrically connects power-supply component-loading pads, or an inner conductive circuit for ground which electrically connects ground component-loading pads is preferred to be formed.

According to another embodiment of the present invention, a method of manufacturing a printed wiring board includes: by gluing or bonding, securing a metal foil to a support board; forming a resin insulation layer on the metal foil; forming openings for via conductors in the resin insulation layer; forming a conductive circuit on the resin insulation layer; forming via conductors in the openings to electrically connect the conductive circuit and the metal foil; separating the support board and the metal foil; and from the metal foil, forming external terminals for electrical connection with other substrates or electronic components.

Here, the metal foil is preferably secured by gluing or bonding its peripheral portions to the support board. In the method of manufacturing a printed wiring board, it is preferred to further include: forming an upper-layer resin insulation layer so as to cover the resin insulation layer and the conductive circuit; forming openings for upper-layer via conductors in the upper-layer resin insulation layer; forming an upper-layer conductive circuit on the upper-layer resin insulation layer; and forming upper-layer via conductors to electrically connect the conductive circuit and the upper-layer conductive circuit.

On the surface of the support board, it is preferred that a metal layer be formed and that the metal layer be a metal foil. Then, the support board and the metal foil are preferably secured by ultrasonic bonding. Also, the support board is preferred to be a metal plate.

By structuring as above, the height of each first pad becomes substantially uniform. As a result, the distance between those pads and the electrodes of an electronic component may be made substantially equal. Accordingly, stresses may be prevented from being exerted on certain bumps, and thus connection reliability may be enhanced.

Also, since the distance between each electrode of an electronic component and each first pad corresponding to each electrode of the electronic component is made equal, the amount of solder to connect them may be reduced. Accordingly, the connection resistance between the electronic component and the printed wiring board may be lowered, thus malfunctions of the electronic component may be prevented. Furthermore, since the amount of solder is reduced, when mounting the component (reflowing), the amount of heat exerted on the printed wiring board may be reduced.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A printed wiring board comprising:
    a plurality of conductive layers having a plurality of conductive circuits;
    a plurality of resin insulation layers having a plurality of openings and including an uppermost resin insulation layer positioned as an outermost layer of the plurality of resin insulation layers, the uppermost resin insulation layer being formed on a second uppermost resin insulation layer;
    a plurality of via conductors formed in the plurality of openings, respectively, and connecting the plurality of conductive circuits in the plurality of conductive layers; and
    a plurality of component-loading pads comprising a copper foil and positioned to load an electronic component,
    wherein the resin insulation layers and the conductive layers are alternately laminated, the component-loading pads are formed on the uppermost resin insulation layer, the component-loading pads are truncated such that an area of a bottom surface touching a surface of the uppermost resin insulation layer is made larger than an area of a top surface on which to load the electronic component, the component-loading pads have side surfaces slanting from the top surface to the bottom surface, the top surface is substantially flat, the via conductors formed in the uppermost resin insulation layer each have a first surface in contact with one of the component-loading pads and a second surface which is opposite to the first surface and in contact with one of the via conductors formed in the second uppermost resin insulation layer, the via conductors formed in the uppermost resin insulation layer are truncated such that the first surface has a smaller area than the second surface, and the second surface has a dented portion to which the via conductor formed in the second uppermost resin insulation layer is connected.

2. The printed wiring board according to claim 1, further comprising a plurality of solder members formed on top surfaces of the component-loading pads on which the electronic component is mounted and on side surfaces of the component-loading pads, respectively.

3. The printed wiring board according to claim 2, wherein the side surfaces of the component-loading pads are roughened.

4. The printed wiring board according to claim 1, wherein the uppermost resin insulation layer does not have a conductive circuit drawn from the component-loading pads toward a periphery of the plurality of resin insulation layers.

5. The printed wiring board according to claim 1, wherein the uppermost resin insulation layer has a pad-forming region in which the component-loading pads are positioned, and the uppermost resin insulation layer has a surface which is exposed and is in a region excluding the pad-forming region.

6. The printed wiring board according to claim 1, further comprising a plurality of protective films formed on top surfaces and side surfaces of the component-loading pads, respectively.

7. The printed wiring board according to claim 1, wherein the plurality of interlayer resin insulation layers includes at least one insulation layer containing a filling material and the filling material does not contain glass cloth and long glass fiber.

8. The printed wiring board according to claim 1, further comprising at least one of an inner conductive circuit for power supply and an inner conductive circuit for ground, wherein the plurality of component-loading pads includes a plurality of power-supply component-loading pads and a plurality of ground component-loading pads, the plurality of component-loading pads is formed in a region in which at least one of the inner conductive circuit for power supply and the inner conductive circuit for ground is formed, the inner conductive circuit for power supply is electrically connected to the power-supply component-loading pads, and the inner conductive circuit for ground is electrically connect to the ground component-loading pads.

* * * * *